(12) United States Patent
Choi et al.

(10) Patent No.: US 6,576,873 B1
(45) Date of Patent: Jun. 10, 2003

(54) SEMICONDUCTOR MANUFACTURING APPARATUS FOR PHOTOLITHOGRAPHIC PROCESS

(75) Inventors: Jin-Young Choi, Chungcheongnam-do (KR); Kun-Woo Nam, Chungcheongnam-do (KR); Young-Koo Yeo, Kynggi-do (KR)

(73) Assignee: DNS Korea Co., Ltd., Chungcheongnam-Do (KR)

( * ) Notice: Subject to any disclaimer, the term of this patent is extended or adjusted under 35 U.S.C. 154(b) by 0 days.

(21) Appl. No.: 09/693,372

(22) Filed: Oct. 19, 2000

(30) Foreign Application Priority Data

Dec. 4, 1999 (KR) .......................................... 1999-54996

(51) Int. Cl.$^7$ .............................................. F27D 11/00
(52) U.S. Cl. ....................................................... 219/390
(58) Field of Search ..................... 438/17, 14; 219/390, 219/411; 118/724

(56) References Cited

U.S. PATENT DOCUMENTS 6,291,800 B1 * 9/2001 Shirakawa et al. ......... 219/390

* cited by examiner

Primary Examiner—John F. Niebling
Assistant Examiner—Andre' C Stevenson
(74) Attorney, Agent, or Firm—Marger Johnson & McCollom, P.C.

(57) ABSTRACT

A semiconductor manufacturing apparatus for a photolithographic process having a coating process and a developing process is described, which includes a first port, a second port, a coating member, and a developing member. The first port and second port have a constant distance from each other, where a substrate comes in and goes out. The coating member, which couples the first port to the second port, carries the substrate between the first port and the second port and carries out the coating process. The developing member, which couples the first port to the second port and is opposite to the coating member, carries the substrate therebetween and carries out the developing process. The apparatus can stably maintain an operating ratio of equipment, and be installed in a relatively small area.

9 Claims, 5 Drawing Sheets

SEMICONDUCTOR MANUFACTURING APPARATUS FOR PHOTOLITHOGRAPHIC PROCESS

This application relies for priority upon Korean Patent Application No. 1999-54996, filed on Dec. 4, 1999, the contents of which are herein incorporated by reference in their entirety.

FIELD OF THE INVENTION

The present invention relates to a semiconductor manufacturing device and, more particularly, to a semiconductor manufacturing apparatus for a photolithographic process including a coating process and a developing process.

BACKGROUND OF THE INVENTION

A variety of steps are applied to a semiconductor manufacturing process, forming an electric circuit on a substrate such as a semiconductor substrate, a glass substrate, and a liquid crystal panel. Photolithography is classified into a coating process, an exposure process, and a developing process. In the coating process, a photoresist (PR) is conformally coated on a surface of the substrate. Light passes a circuit pattern drawn on a mask using a stepper, exposing the circuit pattern to the substrate on which a photoresist layer is formed, in the exposure process. A layer of a light-receiving portion is developed in the developing process.

FIGS. 1–2 schematically illustrate one and another example of a conventional semiconductor manufacturing apparatus for a photolithographic process, respectively.

Referring now to FIG. 1, a semiconductor manufacturing apparatus 200 for a photolithographic process includes a port 210 where a substrate is loaded/unloaded, a spin coater (SCW) 220 for coating a photoresist onto the substrate, a spin developer (SDW) 230 for developing the substrate, a bake unit (BAKE) 240 for heating up the substrate, a wide expose edge wafer (WEEW) 250 for exposing unnecessary photoresist around a circumference of the substrate. The foregoing units are horizontally arranged according to process flow, and divided at both sides of a central path 260. A robot 270, placed in the path 260, carries the substrate to the port 210, an interface 280, or each of the process units. The interface 280 is a port where an exposure system 150 and the substrate comes in and goes out.

Referring now to FIG. 2, similar to the apparatus 200, a semiconductor manufacturing apparatus 300 includes a port 310, a spin coater (SCW) 320, a spin developer (SDW) 330, a bake unit (BAKE) 340, and a wide expose edge wafer (WEEW) 350. The foregoing units are divided at both sides of central paths 360 and 380. To increase operating ratio in comparison with the apparatus 200, the semiconductor manufacturing apparatus 300 utilizes two robots 370 and 390 as a carrier for carrying a substrate. Units for a coating process and units for a developing process are horizontally arranged. A robot is arranged in the coating units and developing units, respectively. A first interface 400 is arranged therebetween. A robot 370 of a coating process region carries a substrate to the port 310, the first interface 400, or each process unit of the coating process region. A robot 390 of a developing process region carries the substrate to the first interface 400, the second interface 410, or each process unit of the developing process. The second interface 410 is a port where the exposure system 150 and the substrate come in and go out.

Technologies related to the foregoing semiconductor manufacturing apparatus are disclosed in U.S. Pat. No. 5,399,531, issued by Wu.

Increasing the operating ratio is subject to limitation. In the semiconductor manufacturing apparatus 200 and 300, a coated substrate is carried to an exposure system and, thereafter, the substrate exposed in the exposure system is developed and outwardly carried. Based upon proceeding order of the photolithography, a substrate can sequentially be carried. If a process of one unit is stagnated, a process of others can be stagnated to drop the operating ratio. If only one specific process (e.g., developing process) requires performing, the operating ratio can also be dropped because other units should be carried through a path where they are arranged. Adding each of the units to the apparatus 300 shown in FIG. 2 from the apparatus 200 shown in FIG. 1 causes increase in an equipment area. This cannot achieve practical increase in the operating ratio. Merely, processing units are increased to raise the operating ratio.

Also, in the prior art, if only a developing process is required, without a coating process, a substrate still had to be transferred through a coating process region. This substantially reduces throughput and process efficiency.

Accordingly, there is a need for a semiconductor manufacturing system or apparatus that does not require such an inefficient transfer path.

SUMMARY OF THE INVENTION

It is therefore an object of the invention to provide a semiconductor manufacturing apparatus for a photolithographic process, which can maximize an operating ratio of equipment.

It is another object of the invention to provide a semiconductor manufacturing apparatus for a photolithographic process, which can be installed with a relatively small area and easily apply a new process.

According to the invention, a semiconductor manufacturing apparatus for a photolithographic process having a coating process and a developing process includes a first port, a second port, a coating unit, and a developing unit. In the first and second ports, a substrate comes in and goes out. There is a constant distance between the first and second substrates. The coating unit is installed to couple the first port to the second port, carry the substrate therebetween, and perform a coating process. The developing unit is opposite to the coating module to couple the first port to the second port, carry the substrate therebetween, and perform a developing operation.

The coating unit is composed of: a first path for coupling the first port to the second port; a coating module installed along one side of the first path; and a first carrier, moving between the first and the second ports through the first path, for carrying the substrate to the first port, the second port, or the coating module. The developing unit is composed of: a second path for coupling the first port to the second port; a developing module installed along one side of the second path; and a second carrier, moving therebetween through the second path, for carrying the substrate to the first port or the second port or the developing module. The second port is coupled to an exposure system.

The first path is installed in the coating module, and the second is installed in the developing module. The first and second paths are isolated from each other by an intermediate wall.

The coating module includes a coating unit for coating photoresist onto the substrate, and a bake unit for heating up the substrate. Here, the coating unit and the bake unit can be stacked. The developing module includes a developing unit for forming a pattern on the substrate using the photoresist, and a bake unit for heating up the substrate. Here, the developing unit and the bake unit can be stacked. The bake unit includes at least one heating plate for heating up the substrate, and at least one cooling plate for cooling down the substrate.

The coating process and the developing process are separately performed to scarcely cause process stagnation. In particular, it is possible to efficiently remove stagnation caused by carrying the substrate. Making the most use of the units is to create a stable operating ratio of equipment. The units are stacked, thereby reducing an installation area and easily applying a new or additional process.

A further understanding of the nature and advantage of the invention herein may be realized by reference to the remaining portions of the specification and the attached drawings.

DESCRIPTION OF THE PREFERRED EMBODIMENT

Figure 1:
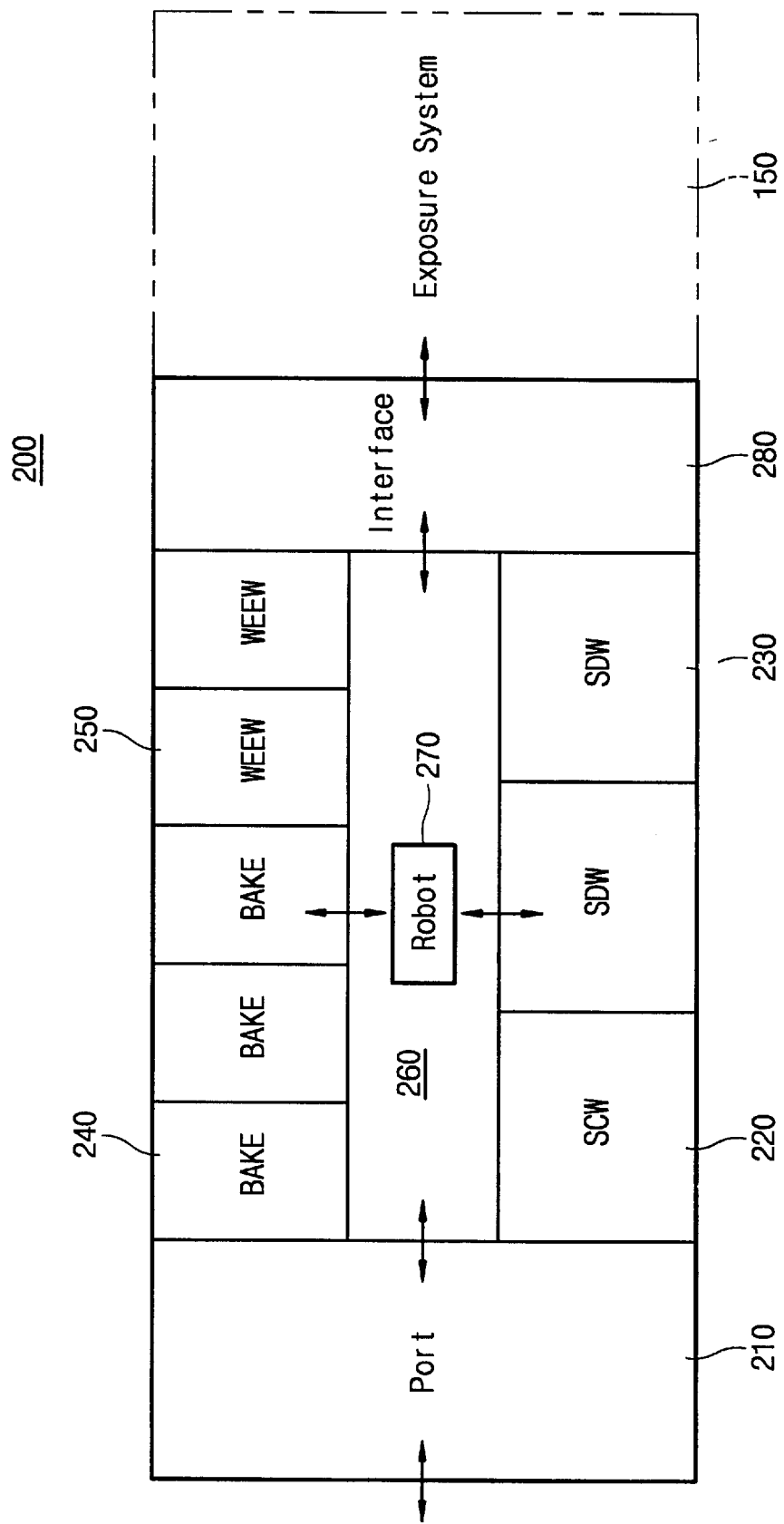
FIG. 1 is a block diagram for illustrating one example of a semiconductor manufacturing apparatus for a photolithographic process in accordance with a prior art.
Figure 2:
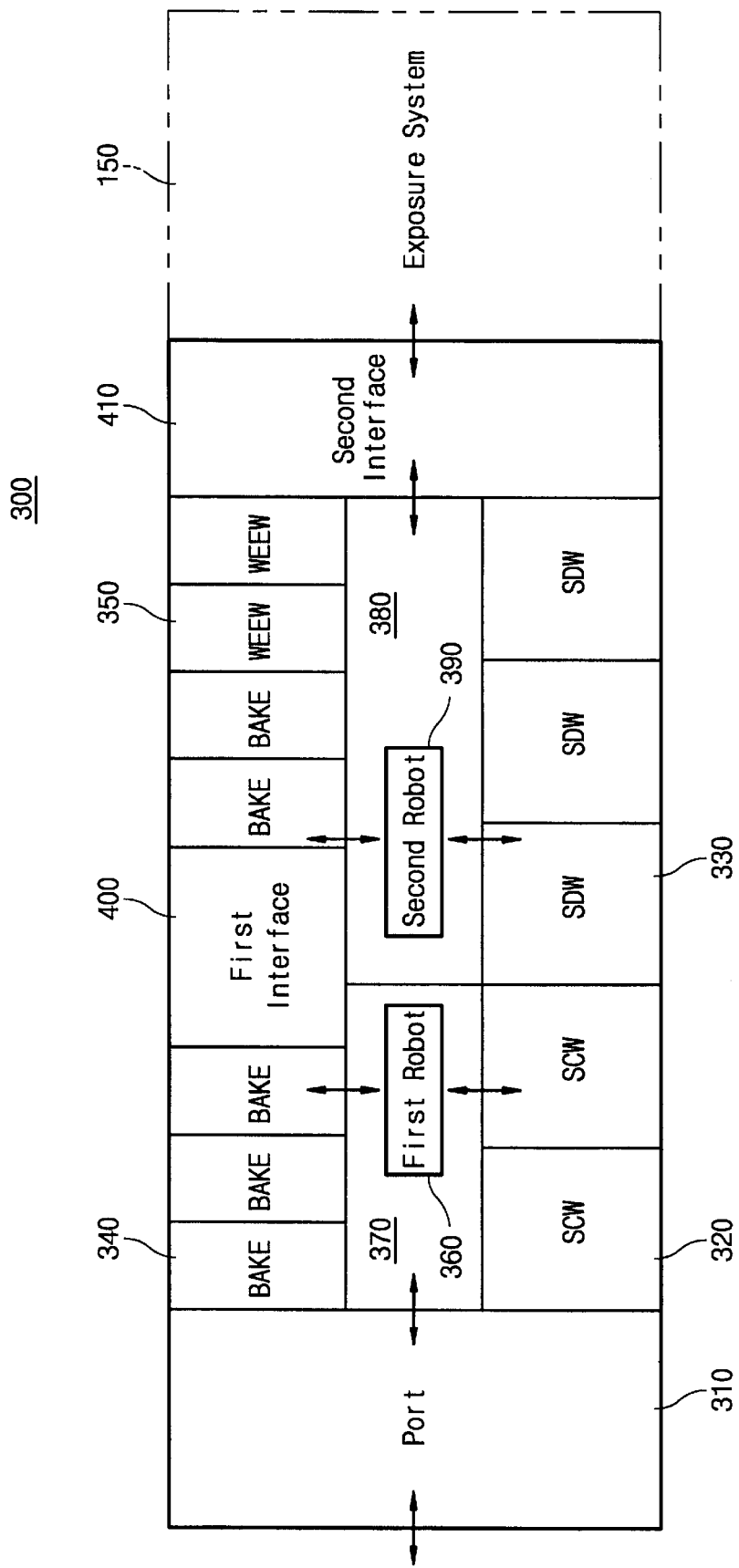
FIG. 2 is a block diagram for illustrating another example of a semiconductor manufacturing apparatus for a photolithographic process in accordance with a prior art.
Figure 3:
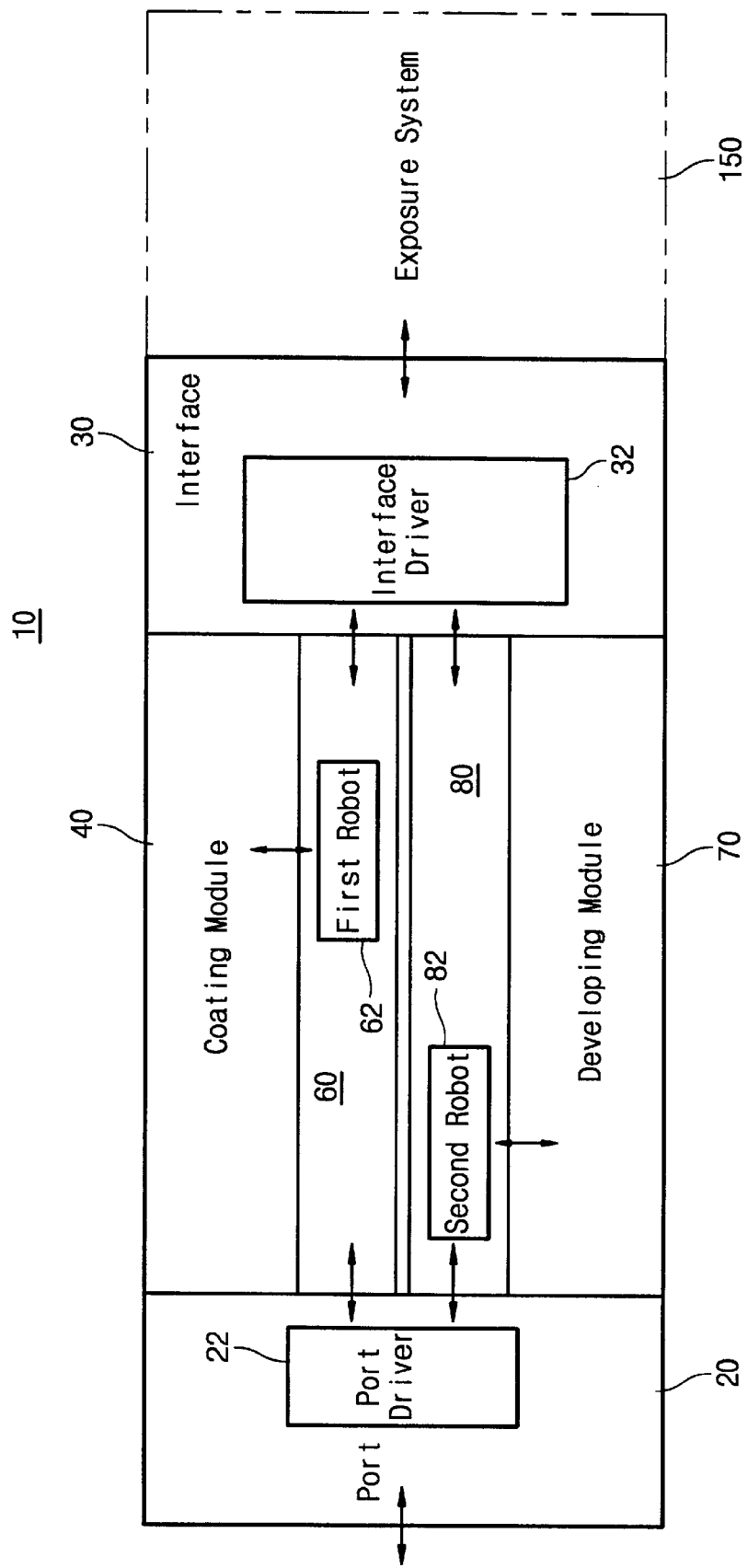
FIG. 3 is a block diagram for illustrating a semiconductor manufacturing apparatus in accordance with the invention.
Figure 4:
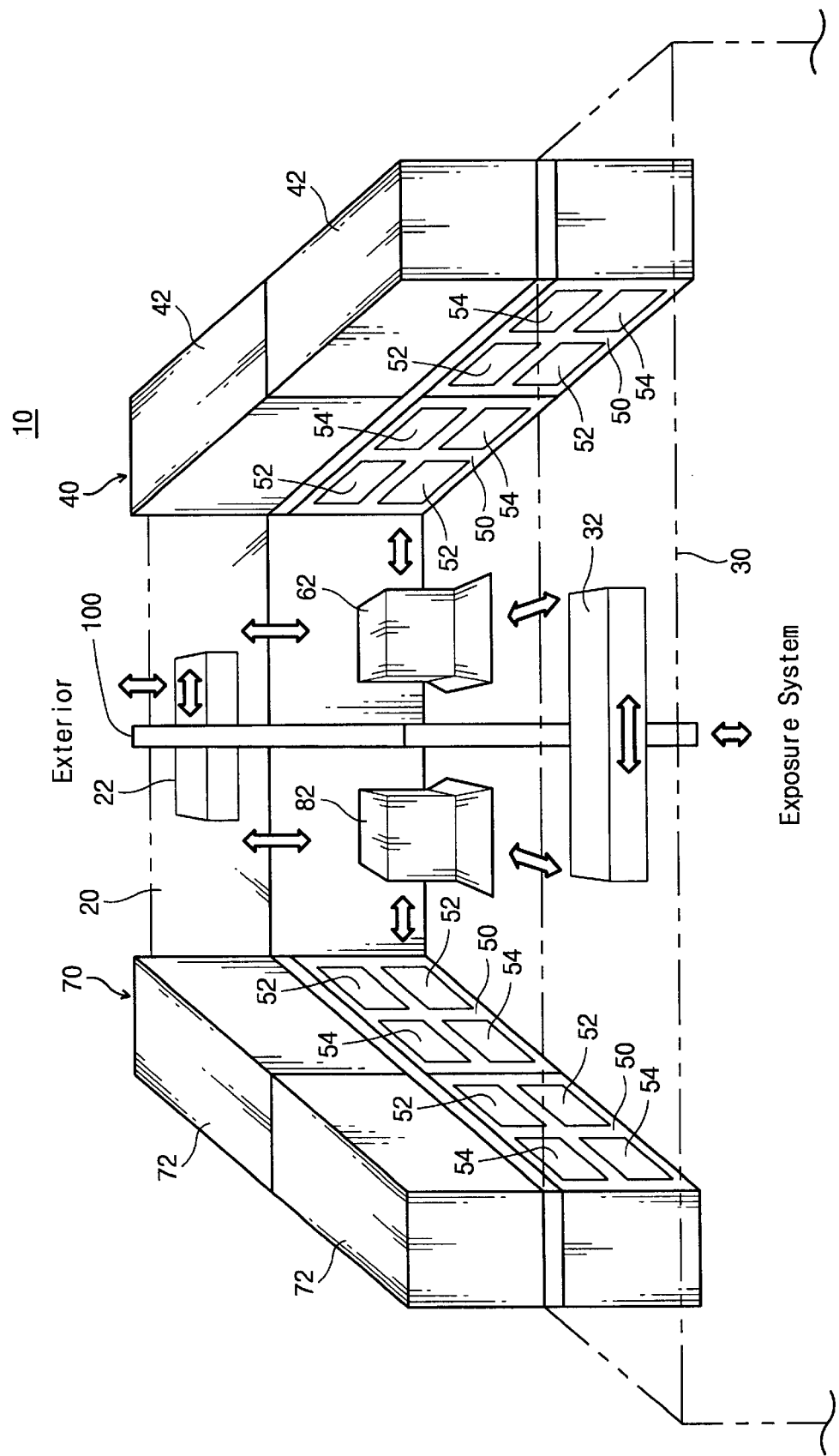
FIG. 4 is a schematic perspective view of a semiconductor manufacturing apparatus shown in FIG. 3.

Now, the present invention will be described more fully hereinafter with reference to attached drawings wherein the same numerals denote the same components;

FIG. 3 is a block diagram of a semiconductor manufacturing apparatus in accordance with the invention, and FIG. 4 is a schematic perspective view of the semiconductor manufacturing apparatus shown in FIG. 3.

Referring now to FIGS. 3–4, a semiconductor manufacturing apparatus 10 for a photolithographic process includes a coating module 40 and a developing module 70 which are arranged in a separate region, respectively. The coating module 40 is composed of coating units, and the developing module 70 is composed of developing units. A first substrate transfer path 60 for carrying a substrate through the coating module 40 is arranged along the coating module 40, and a second substrate transfer path 80 for carrying the substrate through the developing module is arranged along the developing module 70. A variety of methods may be applied to the arrangement thereof. The first path 60 is arranged in the coating module 40, and the second path 80 is arranged in the developing module 70. The first and second paths 60 and 80 are isolated from each other by an intermediate wall 100. A first robot 62, moving the first path 60 to carry the substrate, is located on the first path 60. The second robot 82, moving the second path 80 to carry the substrate, is located on the second path 80. Owing to this structure, the semiconductor manufacturing apparatus 10 can freely carry the substrate between a loading/unloading port 20 where the substrate is loaded/unloaded and an interface port 30 for sending and receiving the substrate to/from an exposure system.

Referring FIGS. 3–4 again, the semiconductor manufacturing apparatus 10 has two ports where a substrate comes in and goes out. One is a loading/unloading port 20 where the apparatus 10 carries out a photolithographic process or a specific process. The other is an interface port 30 having a constant distance from the port 20. A port driver 22 is installed in the port 20 and an interface driver 32 is installed in the interface 30, smoothly carrying the substrate. The coating module 40, the first path 60, and the first robot 62, which couple the port 20 to the interface 30, serve as a coating unit for carrying the substrate therebetween and performing a coating process. The developing module 70, the second path 80, and the second robot 82, which are opposite to the coating unit in line and couple the port 20 to the interface 30, serve as a developing unit for carrying the substrate therebetween and performing a developing process.

Conventionally, although only a developing process requires carrying out, a substrate should be carried through a region of a coating process. This invention solves such a problem, maximizing efficiency of the process.

Units composing a semiconductor manufacturing apparatus are described with reference to FIGS. 5–7, which are perspective views for description of the units.

Figure 5:
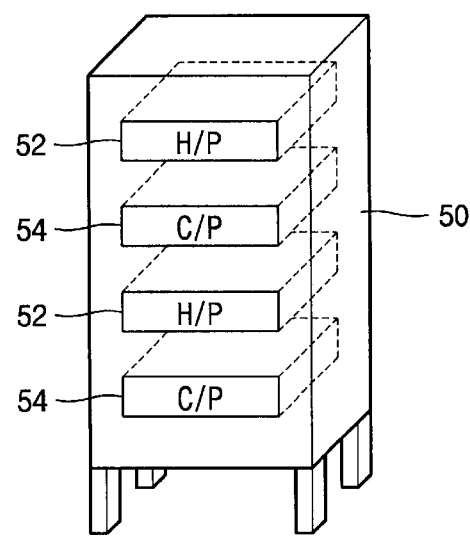
FIG. 5 is a perspective view for schematically showing one example of a bake unit applied to a semiconductor manufacturing apparatus shown in FIG. 3.
Figure 6:
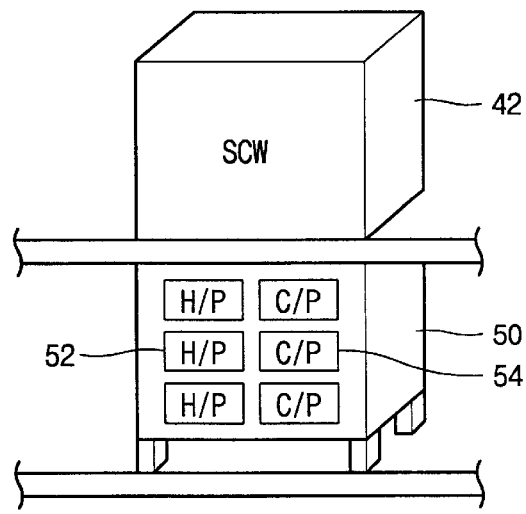
FIG. 6 is a perspective view for schematically showing one example of a coating module applied to a semiconductor manufacturing apparatus shown in FIG. 3.
Figure 7:
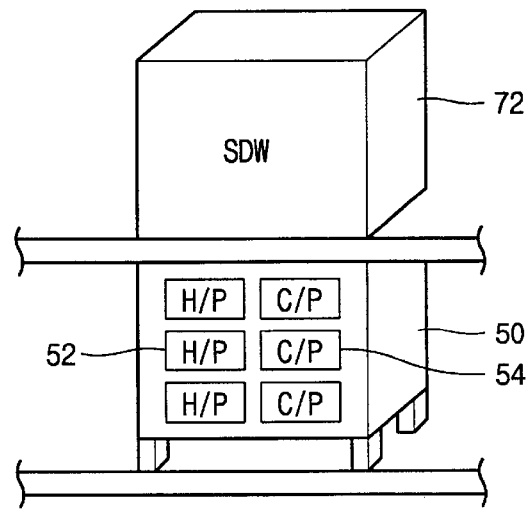
FIG. 7 is a perspective view for schematically showing one example of a developing module applied to a semiconductor manufacturing apparatus shown in FIG. 3.

Referring now to FIGS. 5–7, a semiconductor manufacturing apparatus 10 has the above-mentioned structure. As shown in FIG. 4, units composing a coating module 40 and a developing module 70 are stacked, respectively. In the developing module, as shown in FIG. 7, a developer 72 is stacked on a bake unit 50. The composing units of the modules 40 and 70 can adjust to a substrate size. Various diameters such as 6, 8, 12, 15, and 15 inches have been applied to a wafer, and a size thereof is steadily growing. Therefore, it is necessary to consider a substrate applied to the coating module 40 and the developing module 70.

According to the semiconductor manufacturing apparatus 10 of this invention, an installation area can be reduced and a unit for a new process can easily be applied without variation of other units therein. The bake unit 50 is equipped with a heating plate (H/P) 52 for heating up a substrate and a plurality of cooling plates (C/P) 54 for cooling the heated substrate. The heating and cooling plates 52 and 54 are alternatively stacked (see FIG. 5) or are stacked in a pair (see FIGS. 6–7). For example, a type thereof is two-row and two-step or two-row and five-step.

As so far described, a coating process and a developing process are separately performed to prevent process stagnation. Particularly, stagnation caused by carrying a substrate can efficiently be prevented. Further, the coating process and developing process are separately performed to make the most use of each unit, so that it is possible to stably maintain an operation ratio of equipment. Because each unit is stacked, it can be installed in a relatively small area and a new or additional process can easily be applied.

While particular embodiment of the present invention have been shown and described, it will be obvious to those skilled in the art that changes and modifications may be made without departing from this invention in its broader aspect and, therefore, the appended claims are to encompass within their scope all such changes and modifications as fall within the true spirit and scope of this invention.

What is claimed is:

1. A semiconductor manufacturing apparatus for a photolithographic process including a coating process and a developing process, the apparatus comprising:

a substrate loading/unloading port;

an interface port;

a first substrate transfer path that couples the loading/unloading port to the interface port;

a second substrate transfer path that couples the loading/unloading port to the interface port;

a coating module arranged along one side of the first substrate transfer path to perform a coating process;

a developing module arranged along one side of the second substrate transfer path to perform a developing process;

an exposure system coupled to the interface port, the interface port transferring a substrate between the loading/unloading port and the exposure system;

a first carrier, which moves between the loading/unloading port and the interface port, for carrying a substrate to the loading/unloading port or the interface port or the coating module, along the first substrate transfer path; and a second carrier, which moves between the loading/unloading port and the interface port, for carrying the substrate to the loading/unloading port or the interface port or the developing module, along the second substrate transfer path.

2. The apparatus of claim 1, wherein loading/unloading in the loading/unloading port can be performed concurrently in the first and the second substrate transfer paths.

3. The apparatus of claim 1, wherein the coating module includes a coating unit for coating photoresist onto the substrate and a bake unit for heating up the substrate, wherein the coating unit and the bake unit are stacked.

4. The apparatus of claim 1, wherein the developing module includes a developing unit for forming a pattern on the substrate and a bake unit for heating up the substrate, wherein the developing unit and the bake unit are stacked.

5. The apparatus of claim 3 or claim 4, wherein the bake unit includes at least one heating plate for heating up the substrate and at least one cooling plate for cooling down the heated substrate.

6. The apparatus of claim 1, wherein the coating module and the developing module are isolated from each other by an intermediate wall disposed therebetween.

7. The apparatus of claim 6, wherein the first and second substrate transfer paths extend horizontally adjacent to each other.

8. The apparatus of claim 1, wherein the first and second substrate transfer paths extend horizontally parallel with each other.

9. The apparatus of claim 1, wherein the substrate is configured to travel in a looped path from the loading/unloading port along the first transfer path to the interface port and from the interface port along the second transfer path back to the loading/unloading port.

* * * * *